US012035490B2

United States Patent
Zhu et al.

(10) Patent No.: US 12,035,490 B2
(45) Date of Patent: Jul. 9, 2024

(54) SWITCHED-MODE LIGHT-EMITTING DIODE (LED) DISPLAY UNIT SATISFYING FIRE-FIGHTING SMOKE EXHAUST VENTILATION REQUIREMENTS

(71) Applicant: NANJING LOPU CO., LTD., Nanjing (CN)

(72) Inventors: Bin Zhu, Nanjing (CN); Chengyue Lv, Nanjing (CN); Jianming Qiu, Nanjing (CN); Lili Ji, Nanjing (CN); Chengbing Guo, Nanjing (CN)

(73) Assignee: NANJING LOPU CO., LTD., Nanjing (CN)

( * ) Notice: Subject to any disclaimer, the term of this patent is extended or adjusted under 35 U.S.C. 154(b) by 254 days.

(21) Appl. No.: 17/701,724

(22) Filed: Mar. 23, 2022

(65) Prior Publication Data

US 2023/0171903 A1    Jun. 1, 2023

Related U.S. Application Data

(63) Continuation of application No. PCT/CN2021/136702, filed on Dec. 9, 2021.

(30) Foreign Application Priority Data

Nov. 30, 2021   (CN) .......................... 202111438320.1

(51) Int. Cl.
*H05K 5/02* (2006.01)
*E05B 17/22* (2006.01)
(Continued)

(52) U.S. Cl.
CPC .......... *H05K 5/0204* (2013.01); *E05B 17/22* (2013.01); *E05B 47/0012* (2013.01); *E05B 65/006* (2013.01); *E05F 1/1016* (2013.01); *E05F 15/53* (2015.01); *E05F 15/611* (2015.01); *F24F 7/00* (2013.01); *H01L 23/32* (2013.01); *E05B 2047/0017* (2013.01); *E05Y 2201/422* (2013.01); *E05Y 2201/434* (2013.01); *E05Y 2201/448* (2013.01); *E05Y 2201/484* (2013.01);
(Continued)

(58) Field of Classification Search
CPC ...... H05K 5/0204; E05F 15/53; E05F 15/611; E05B 17/22
USPC ........................................................ 361/807
See application file for complete search history.

(56) References Cited

U.S. PATENT DOCUMENTS 9,644,823 B2 * 5/2017 Hemiller ................. F21V 21/34
2006/0279493 A1 * 12/2006 Syrstad ..................... G09F 9/33
345/82

* cited by examiner

*Primary Examiner* — Binh B Tran
(74) *Attorney, Agent, or Firm* — Bayramoglu Law Offices LLC

(57) ABSTRACT

A switched-mode light-emitting diode (LED) display unit satisfying fire-fighting smoke exhaust and ventilation requirements includes an LED display unit, a mounting member, an opening-closing actuator and a pressing member. The LED display unit is mounted on the mounting member and the mounting member is mounted on a display panel by an opening-closing actuator and pressed against the display panel by a pressing member. The switched-mode LED display unit provides the pressing member that works to release the pressed mounting member after obtaining a triggering command and the opening-closing actuator that turns on the LED display unit subsequently, thereby meeting the fire smoke exhaust ventilation requirement of the internal surface or the external surface of a building.

5 Claims, 11 Drawing Sheets

(51) Int. Cl.
  *E05B 47/00* (2006.01)
  *E05B 65/00* (2006.01)
  *E05F 1/10* (2006.01)
  *E05F 15/53* (2015.01)
  *E05F 15/611* (2015.01)
  *F24F 7/00* (2021.01)
  *H01L 23/32* (2006.01)

(52) U.S. Cl.
  CPC ... *E05Y 2201/686* (2013.01); *E05Y 2800/252* (2013.01); *E05Y 2900/13* (2013.01); *E05Y 2999/00* (2024.05); *F24F 2007/0025* (2021.01)

SWITCHED-MODE LIGHT-EMITTING DIODE (LED) DISPLAY UNIT SATISFYING FIRE-FIGHTING SMOKE EXHAUST VENTILATION REQUIREMENTS

CROSS REFERENCE TO THE RELATED APPLICATIONS

This application is a continuation application of International Application No. PCT/CN2021/136702, filed on Dec. 9, 2021, which is based upon and claims priority to Chinese Patent Application No. 202111438320.1, filed on Nov. 30, 2021, the entire contents of which are incorporated herein by reference.

TECHNICAL FIELD

The present disclosure relates to the field of light-emitting diode (LED) display technology and, in particular, to a switched-mode LED display unit satisfying fire-fighting smoke exhaust and ventilation requirements.

BACKGROUND

In the display field, compared with liquid crystal display (LCD), digital light processing (DLP), projection and the like, LED display screens have become favored choices of consumers for their intrinsic advantages of high brightness, seamless splicing, being not affected by area, and the like. Conventional screens and creative display screens emerge increasingly. Such display screens have been extensively applied with increasing screen areas.

In practical use, when a large-area display screen is used as the internal surface or the external surface of a building, the influence and limitation of the construction of the building need to be considered at the beginning of design. Furthermore, the requirements of fire safety rules of building design, such as fire-fighting ventilation and smoke exhaust, need to be satisfied. In some special circumstances, such requirements must be satisfied. For a complex engineering project, a conventional screen can only satisfy the obligatory requirements by reducing the screen area or lowering parameter configuration.

SUMMARY

The present disclosure solves the problem that the fire-fighting smoke exhaust requirement can only be met by reducing the area or reducing parameters in the prior art, and provides a switched-mode LED display unit satisfying fire-fighting smoke exhaust and ventilation requirements. The present disclosure provides a pressing member that works to release the pressed mounting member after obtaining a triggering command and an opening-closing actuator that turns on the LED display unit subsequently, thereby meeting the fire smoke exhaust ventilation requirement of the internal surface or the external surface of a building.

To solve the above-mentioned technical problem, the present disclosure is implemented through the following technical solutions: a switched-mode LED display unit satisfying fire-fighting smoke exhaust and ventilation requirements includes an LED display unit, a mounting member, an opening-closing actuator and a pressing member. The LED display unit is mounted on the mounting member and the mounting member is mounted on a display panel by the opening-closing actuator and pressed against the display panel by the pressing member.

As a preferred solution, the opening-closing actuator may be a spring hinge which is mounted on one side of the mounting member.

As a preferred solution, the opening-closing actuator may be a spring hinge assembly which is mounted in the middle of the mounting member. The spring hinge assembly includes a spring hinge, a connecting shaft, and connecting pieces. At least two connecting pieces are mounted on the connecting shaft. The connecting pieces are mounted on the mounting member. The spring hinge is mounted at two ends of the connecting shaft and connected to and fixed to an adjacent fixing unit by a spacer.

As a preferred solution, the opening-closing actuator may be a motor assembly which includes a first steering engine, a connecting shaft, connecting pieces and a bearing. At least two connecting pieces are mounted on the connecting shaft. The connecting pieces are mounted on the mounting member. The first steering engine is connected to and fixed to an adjacent fixing unit by a first steering engine support. The connecting shaft has one end connected to the steering engine by a shaft sleeve and the other end inserted into the bearing. The bearing is fixed to the adjacent fixing unit.

As a preferred solution, the opening-closing actuator may be a pneumatic/hydraulic rod which has one end fixed to an adjacent fixing unit by a mounting seat and the other end connected to the mounting member. One end of the mounting member is hinged to the display panel.

As a preferred solution, the pressing member may be an electrically controlled switch gear which includes a second steering engine, a stop piece, and a second steering engine support. The second steering engine is connected to and fixed to an adjacent fixing unit by the second steering engine support. The stop piece drives and presses the mounting member by the second steering engine.

As a preferred solution, the pressing member may be a high-temperature automatic tripping gear which includes a housing, a push rod, a nut, and thermal expansion glass. The housing is fixed to an adjacent fixing unit by a housing support. The push rod is sleeved with a spring. The push rod has one end inserted into the housing and the other end located outside the housing to press the mounting member. The nut is mounted at one end of the housing. The thermal expansion glass is mounted at an end, located in the housing, of the push rod and fastened by a locking screw.

Compared with the prior art, the present disclosure has the following beneficial effects: the present disclosure provides the pressing member that works to release the pressed mounting member after obtaining a triggering command and the opening-closing actuator that turns on the LED display unit subsequently, thereby meeting the fire smoke exhaust ventilation requirement of the internal surface or the external surface of a building.

LIST OF REFERENCE NUMERALS

Figure 1:
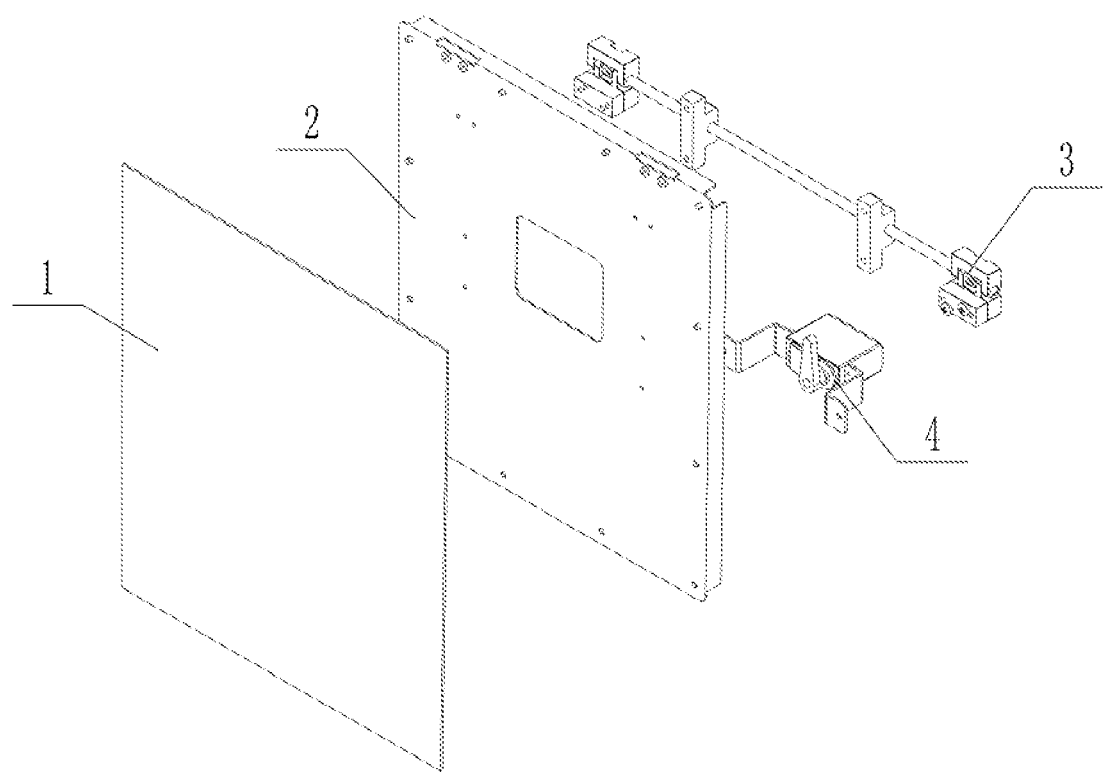
FIG. 1 is an exploded view according to the present disclosure.

1—LED display unit, 2—mounting member, 3—opening-closing actuator, 301—spring hinge, 302—connecting shaft, 303—connecting piece, 304—first steering engine, 305—first steering engine support, 306—bearing, 307—shaft sleeve, 4—pressing member, 401—second steering engine, 402—stop piece, 403—second steering engine support, 404—housing, 405—push rod, 406—spring, 407—housing support, 408—nut, 409—thermal expansion glass, and 410—locking screw.

DETAILED DESCRIPTION OF THE EMBODIMENTS

The technical solutions in examples of the present disclosure will be described below clearly and completely with reference to the accompanying drawings in the examples of the present disclosure. Apparently, the described examples are merely some rather than all of the examples of the present disclosure. The following description of at least one exemplary embodiment is merely illustrative, and not intended to limit the present disclosure and application or use thereof in any way. All other examples obtained by a person of ordinary skill in the art based on the examples of the present disclosure without creative efforts shall fall within the protection scope of the present disclosure.

It should be noted that the terms used herein are merely used for describing the specific embodiments, but are not intended to limit the exemplary embodiments of the present disclosure. As used herein, the singular forms are intended to include the plural forms as well, unless the context clearly indicates otherwise, and also, it should be understood that when the terms "include" and/or "comprise" are used in this specification, they indicate that there are features, steps, operations, devices, elements, and/or combinations thereof.

Unless otherwise specified, the relative arrangement, numerical expressions and numerical values of components and steps set forth in these examples do not limit the scope of the present disclosure. Meanwhile, it should be understood that for ease of description, each portion in the accompanying drawings is not necessarily drawn to the actual scale. The technologies, methods, and equipment known to those of ordinary skill in the art may not be discussed in detail, but where appropriate, the technologies, methods, and equipment should be regarded as part of the authorized specification. In all examples shown and discussed herein, any specific value should be interpreted as merely exemplary, rather than restrictive. Therefore, other examples of the exemplary examples may have different values. It should be noted that similar reference signs and letters represent similar items in the accompanying drawings below. Therefore, once an item is defined in one drawing, it does not need to be further discussed in subsequent drawings.

It should be understood that, in the description of the present disclosure, terms such as "front", "rear", "upper", "lower", "left", "right", "transverse", "longitudinal", "vertical", "horizontal", "top" and "bottom" indicate orientation or position relationships based on the accompanying drawings. Unless otherwise specified, these terms are merely intended to facilitate or simplify the description of the present disclosure, rather than to indicate or imply that the mentioned device or components must have a specific orientation and must be constructed and operated in a specific orientation. Therefore, they should not be construed as a limitation to the protection scope of the present disclosure. The orientation terms "inner" and "outer" refer to the inner and outer parts relative to the contour of the mentioned component.

For ease of description, spatially relative terms, such as "above", "on the upper side of", "on the upper surface of" and "on", can be used to describe the spatial positional relationship between components or features shown in the figure. It should be understood that the spatially relative terms are intended to encompass different orientations of the components in use or operation in addition to those shown in the figure. For example, if a component in the figure is inverted, it is described as a component "above other component or structure" or "on other component or structure". Therefore, the component will be positioned as "below other component or structure" or "under other component or structure". Therefore, the exemplary term "above" may include both orientations "above" and "below". The component may also be positioned in other different ways (rotated by 90 degrees or in other orientations), but the relative description of the space should be explained accordingly.

In addition, it needs to be noted that the use of such words as "first" and "second" to define components is merely intended to distinguish the corresponding components. Unless otherwise stated, such words have no special meaning and thus cannot be construed as limiting the protection scope of the present disclosure.

The LED display unit involved in each example may be a module, a group, a box, or a combination of them. The shape of the LED display unit may be square, rectangle, trapezoid, triangle, or circle. There may be a single LED display unit, or there may be a plurality of LED display units mounted on a single opening-closing actuator 3 and a pressing member 4, and the LED display units may be assembled into a flat screen, a curved screen, a spherical screen, a cylindrical screen or a shaped screen formed by joining various shapes mentioned above. Opening-closing manners mainly include axial rotating opening and closing and fore-and-aft pushing opening and closing, where the axial rotating opening and closing is suitable for small-size and low-weight LED modules; and the fore-and-aft pushing opening and closing is suitable for large-size and high-weight LED groups and LED boxes.

EXAMPLE 1

Figure 4:
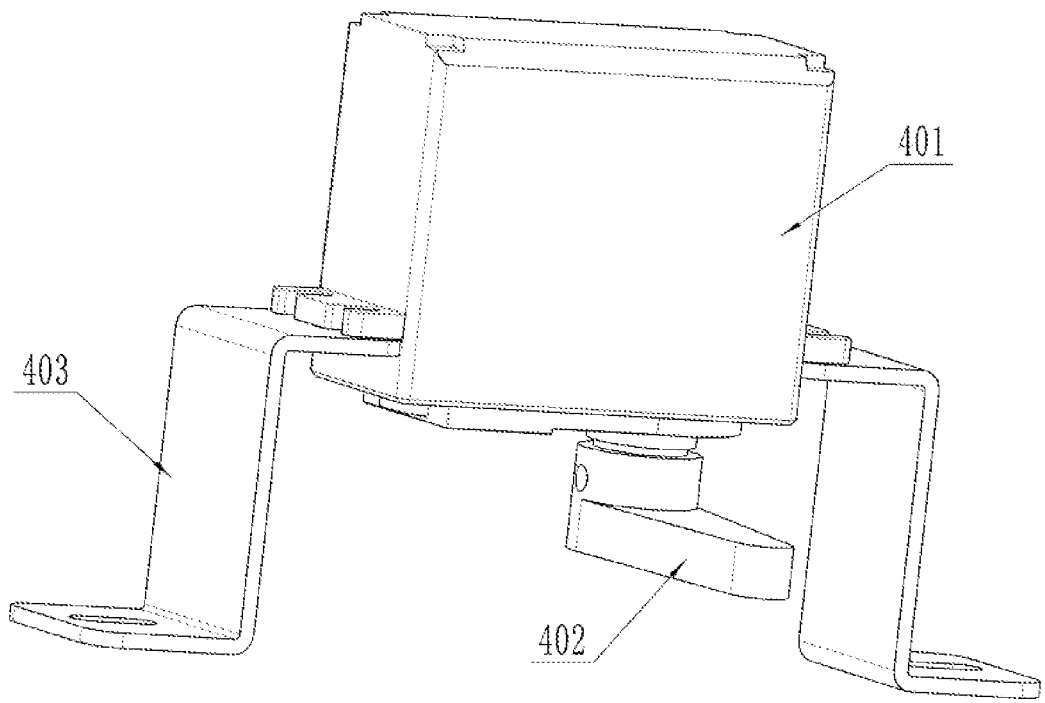
FIG. 4 is an axonometric view of an electrically controlled switch gear according to the present disclosure.
Figure 5:
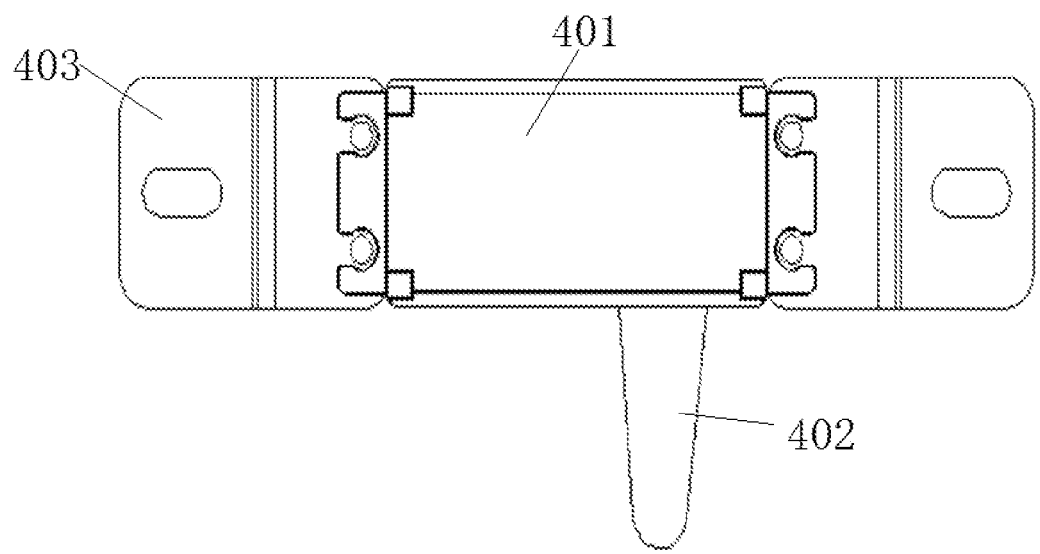
FIG. 5 is a top view of the electrically controlled switch gear according to the present disclosure.
Figure 8:
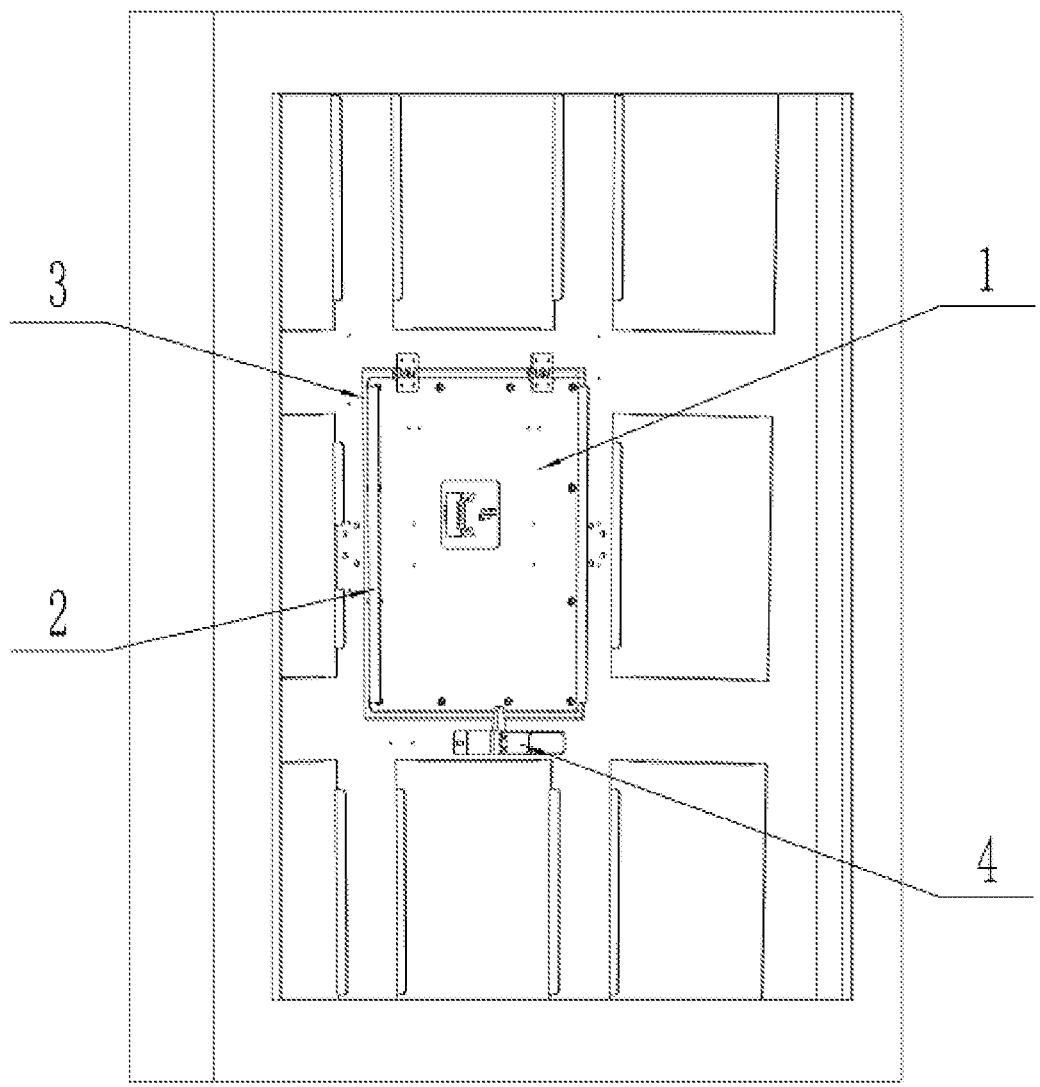
FIG. 8 is a structure diagram of a closed LED display unit according to Example 1 of the present disclosure.
Figure 9:
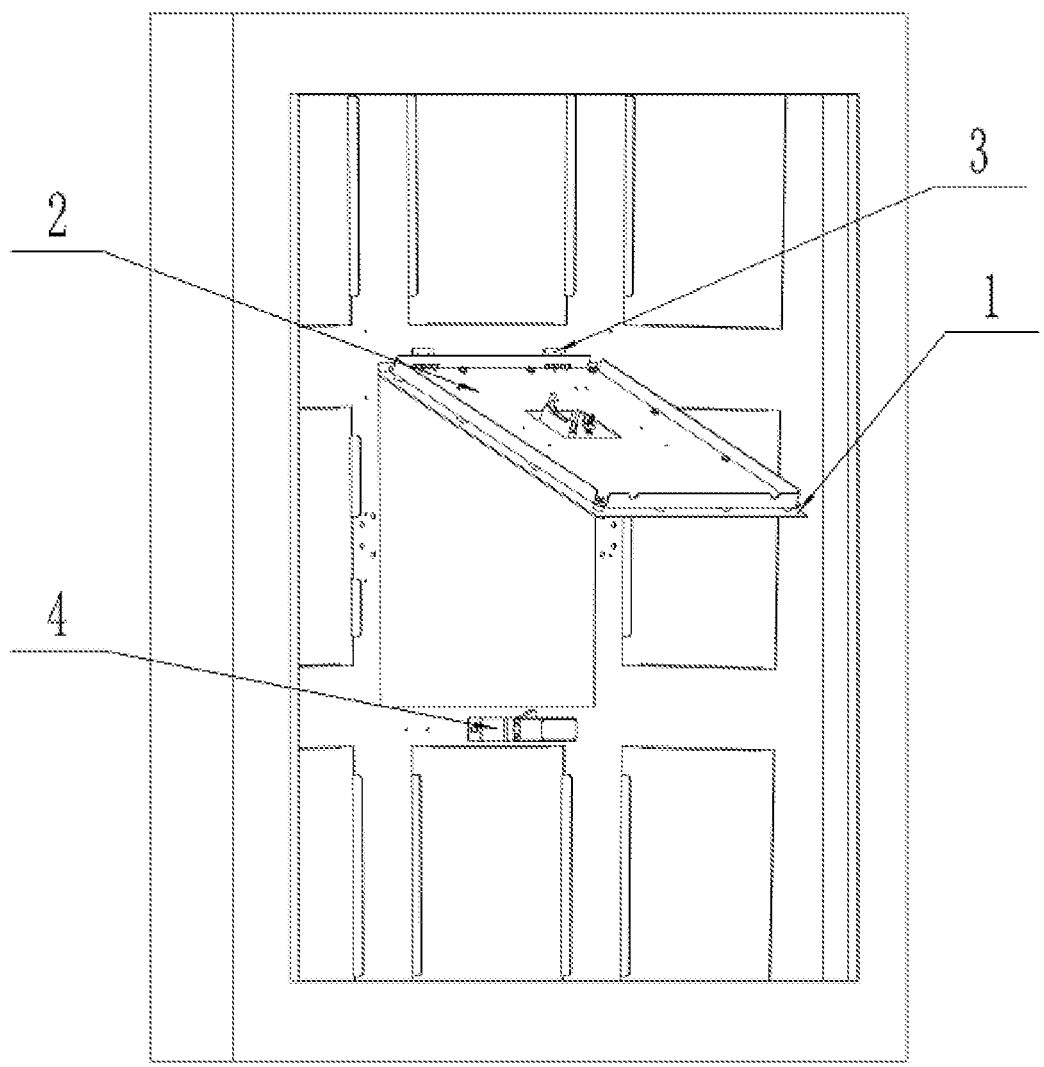
FIG. 9 is a structure diagram of an opened LED display unit according to Example 1 of the present disclosure.

As shown in FIG. 8 and FIG. 9, a switched-mode LED display unit satisfying fire-fighting smoke exhaust and ventilation requirements includes an LED display unit 1, a mounting member 2, an opening-closing actuator 3, and a pressing member 4. The LED display unit 1 is mounted on the mounting member 2 and the mounting member 2 is mounted on a display panel by the opening-closing actuator 3 and pressed against the display panel by the pressing member 4. In particular, the opening-closing actuator 3 is a spring hinge 301 which is mounted on one side of the mounting member 2 by a screw. As shown in FIG. 4 and FIG. 5, the pressing member 4 takes the form of an electrically controlled switch gear which includes a second steering engine 401, a stop piece 402, and a second steering engine support 403. The second steering engine 401 is connected to and fixed to an adjacent fixing unit by the second steering engine support 403 and the stop piece 402 drives and presses the mounting member 2 by the second steering engine 401. In case of a fire, the electrically controlled switch gear receives a triggering command (the triggering command is a signal given by a fire-fighting linkage control system of the building or a manually set signal) to work. The second steering engine 401 rotates to drive the stop piece 402 to rotate; as such, the mounting member 2 is not blocked by the stop piece 402 anymore and is driven by the spring hinge 301 to rotate. Thus, the opening of the LED display unit 1 and the mounting member 2 is achieved, such that "the window is opened". Accordingly, the fire smoke exhaust ventilation requirement of the internal surface or the external surface of the building is met. After the alarm is cleared, "the window is closed" such that the display screen becomes an integrated seamless one. The LED display unit 1 may be reset manually or automatically.

EXAMPLE 2

Figure 6:
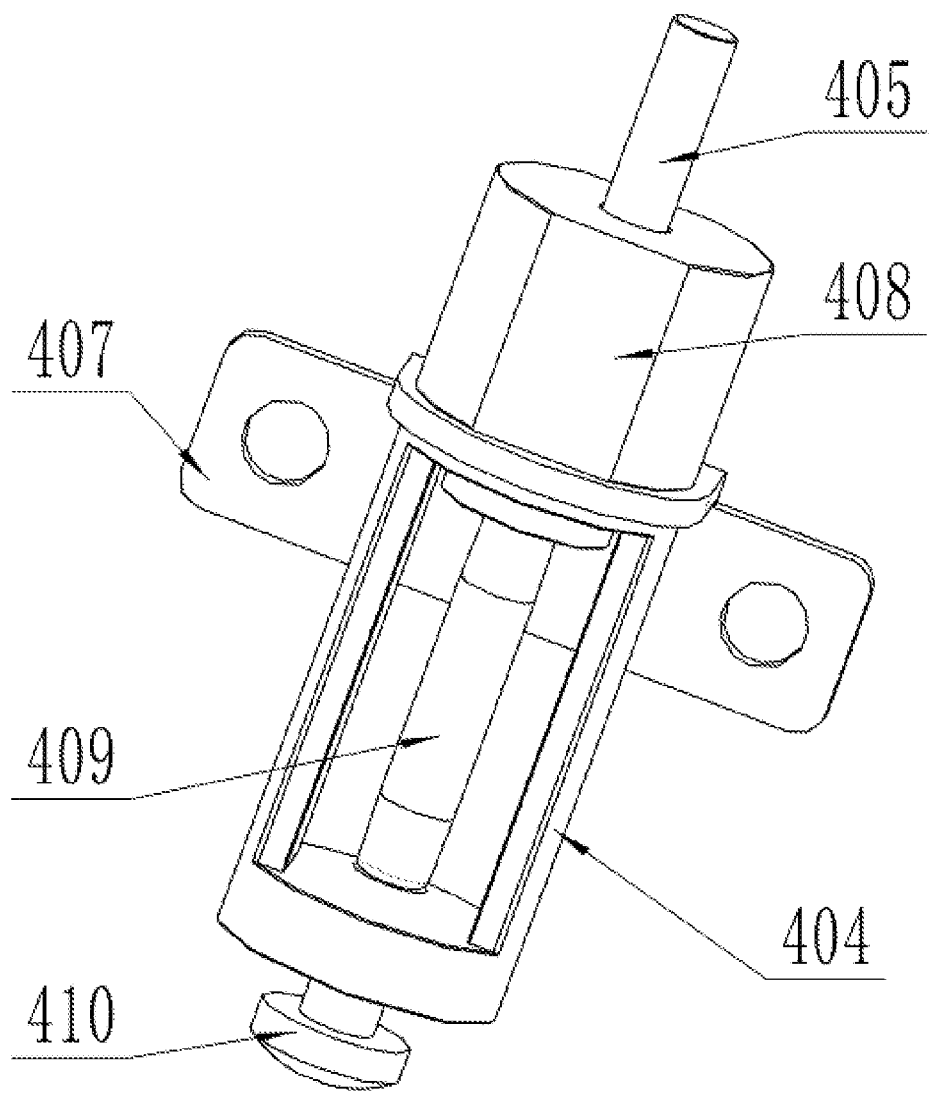
FIG. 6 is a structure diagram of a high-temperature automatic tripping gear according to the present disclosure.
Figure 7:
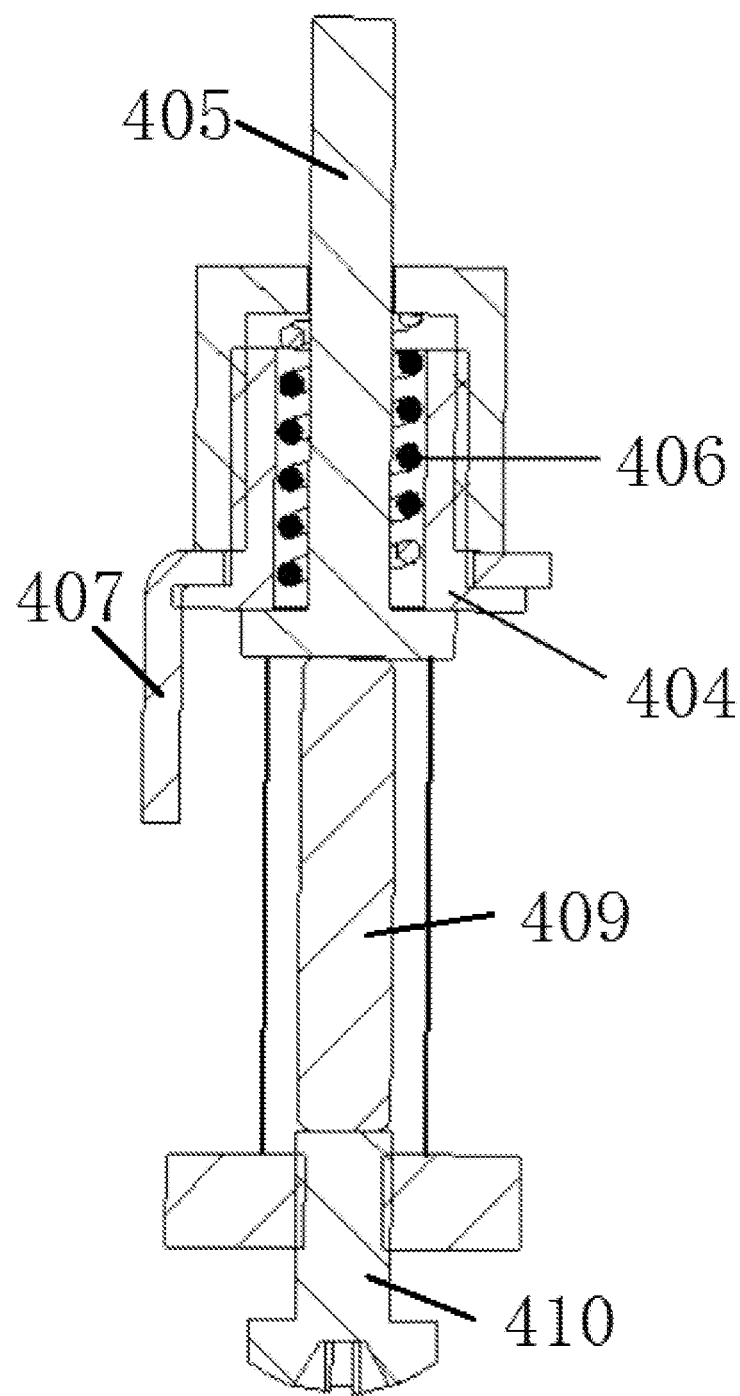
FIG. 7 is a cross-sectional view of the high-temperature automatic tripping gear according to the present disclosure.
Figure 10:
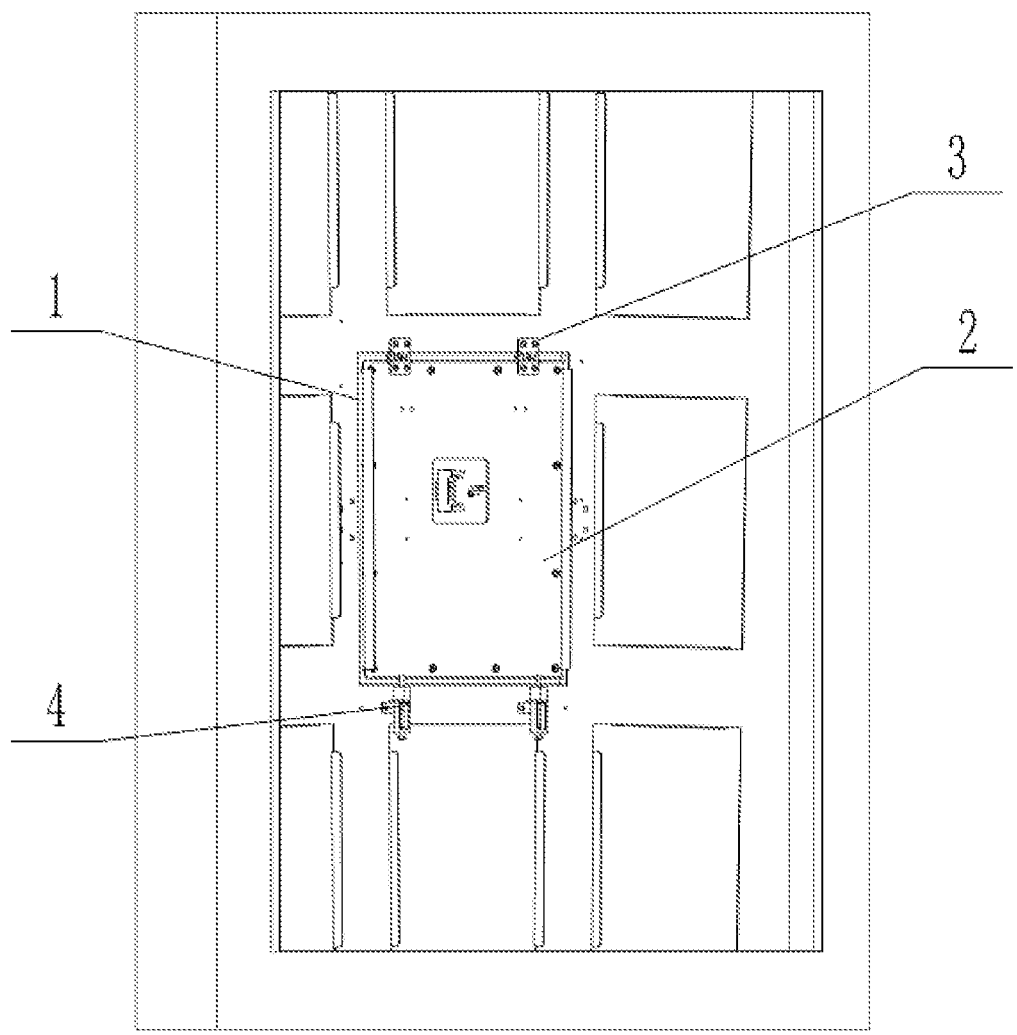
FIG. 10 is a structure diagram of Example 2 of the present disclosure.

As shown in FIG. 10, a switched-mode LED display unit satisfying fire-fighting smoke exhaust and ventilation requirements includes an LED display unit 1, a mounting member 2, an opening-closing actuator 3, and a pressing member 4. The LED display unit 1 is mounted on the mounting member 2 and the mounting member 2 is mounted on a display panel by the opening-closing actuator 3 and pressed against the display panel by the pressing member 4. In particular, the opening-closing actuator 3 is a spring hinge 301 which is mounted on one side of the mounting member 2 by a screw. As shown in FIG. 6 and FIG. 7, the pressing member 4 takes the form of a high-temperature automatic tripping gear which includes a housing 404, a push rod 405, a nut 408, and thermal expansion glass 409. The housing 404 is fixed to an adjacent fixing unit by a housing support 407. The push rod 405 is sleeved with a spring 406. The push rod 405 has one end inserted into the housing 404 and the other end located outside the housing 404 to press the mounting member 2. The nut 408 is mounted at one end of the housing 404. The thermal expansion glass 409 is mounted at an end, located in the housing 404, of the push rod 405 and fastened by a locking screw 410. In case of a fire, when the temperature rises to a certain degree, the thermal expansion glass 409 is broken. The push rod 405 is pushed by the spring 406 to slide down and the head of the push rod 405 is disengaged from the mounting member 2. As such, the mounting member 2 is not blocked by the push rod 405 anymore and is driven by the spring hinge 301 to rotate, such that "the window is opened". Accordingly, the fire smoke exhaust ventilation requirement of the internal surface or the external surface of the building is met. After the alarm is cleared, "the window is closed" (reset) such that the display screen becomes an integrated seamless one. The LED display unit 1 may be reset manually or automatically.

EXAMPLE 3

Figure 2:
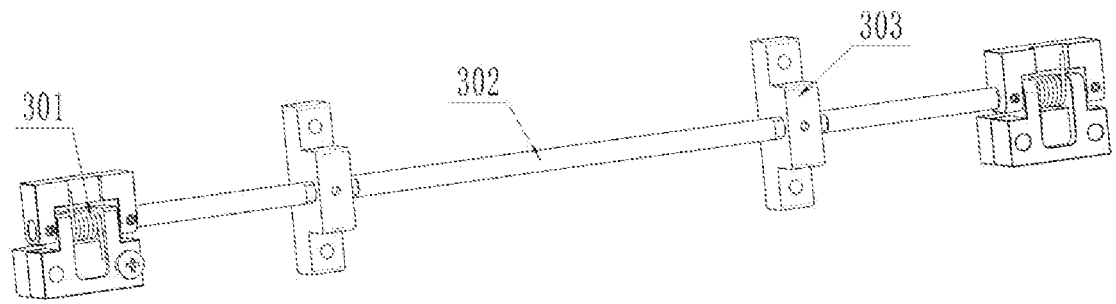
FIG. 2 is a structure diagram of a spring hinge assembly according to the present disclosure.
Figure 11:
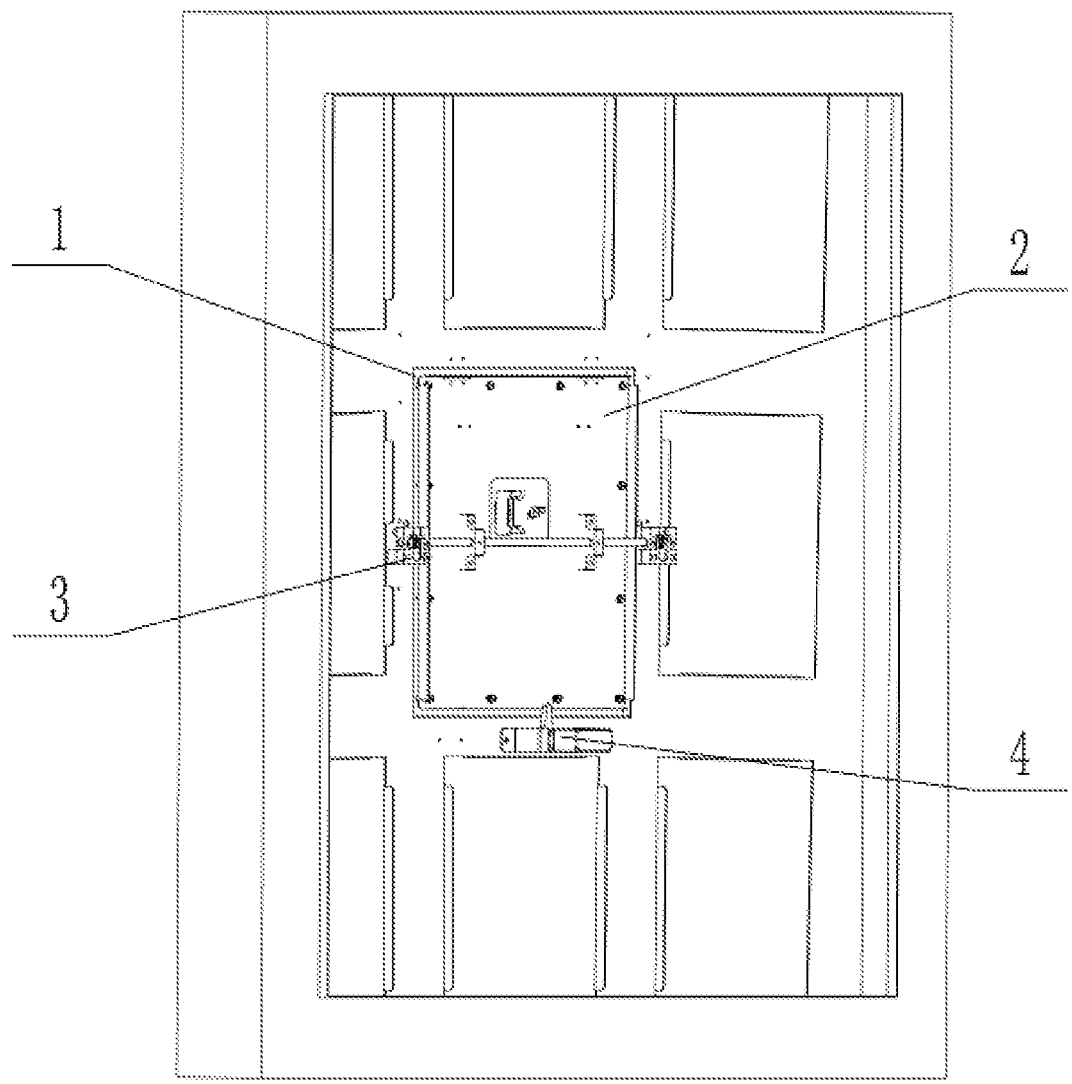
FIG. 11 is a structure diagram of Example 3 of the present disclosure.

As shown in FIG. 11, a switched-mode LED display unit satisfying fire-fighting smoke exhaust and ventilation requirements includes an LED display unit 1, a mounting member 2, an opening-closing actuator 3, and a pressing member 4. The LED display unit 1 is mounted on the mounting member 2 and the mounting member 2 is mounted on a display panel by the opening-closing actuator 3 and pressed against the display panel by the pressing member 4. In particular, as shown in FIG. 2, the opening-closing actuator 3 takes the form a spring hinge assembly which is mounted in the middle of the mounting member 2. The spring hinge assembly includes a spring hinge 301, a connecting shaft 302, and connecting pieces 303. At least two connecting pieces 303 are mounted on the connecting shaft 302. The connecting pieces 303 are mounted on the mounting member 2. The spring hinge 301 is mounted at two ends of the connecting shaft 302 and connected to and fixed to an adjacent fixing unit by a spacer. As shown in FIG. 4 and FIG. 5, the pressing member 4 takes the form of an electrically controlled switch gear which includes a second steering engine 401, a stop piece 402, and a second steering engine support 403. The second steering engine 401 is connected to and fixed to an adjacent fixing unit by the second steering engine support 403, and the stop piece 402 drives and presses the mounting member 2 by the second steering engine 401. In case of a fire, the electrically controlled switch gear receives a triggering command (the triggering command is a signal given by a fire-fighting linkage control system of the building or a manually set signal) to work. The second steering engine 401 rotates to drive the stop piece 402 to rotate; as such, the mounting member 2 is not blocked by the stop piece 402 anymore and is driven by the spring hinge 301 to rotate. Thus, opening of the LED display unit 1 and the mounting member 2 is achieved, such that "the window is opened". Accordingly, the fire smoke exhaust ventilation requirement of the internal surface or the external surface of the building are met. After the alarm is cleared, "the window is closed" such that the display screen becomes an integrated seamless one. The LED display unit 1 may be reset manually or automatically.

EXAMPLE 4

Figure 3:
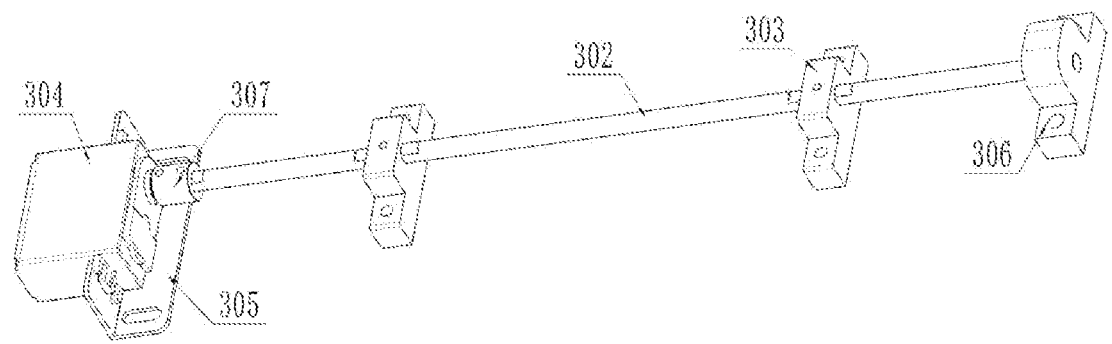
FIG. 3 is a structure diagram of a motor assembly according to the present disclosure.
Figure 12:
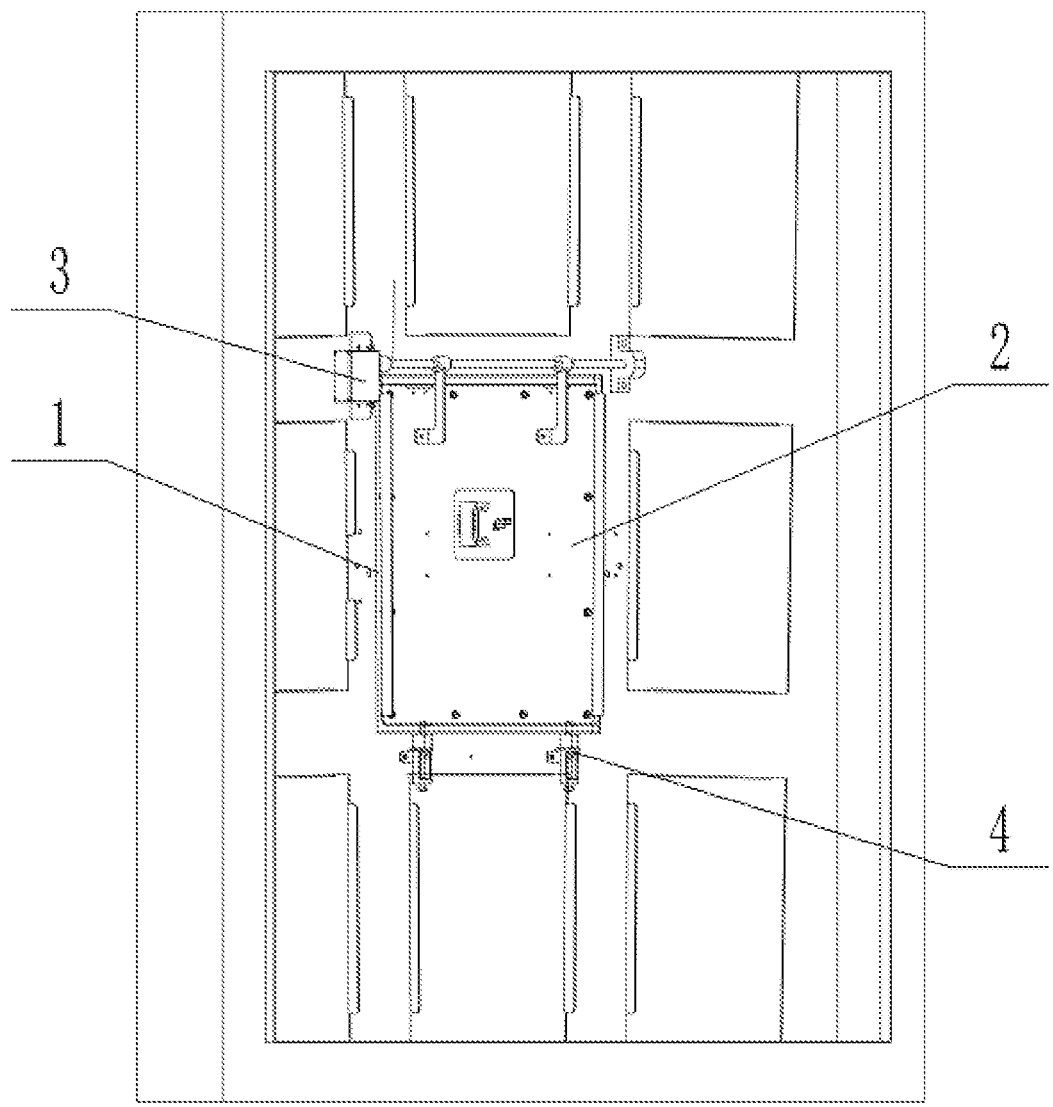
FIG. 12 is a structure diagram of Example 4 of the present disclosure.

As shown in FIG. 12, a switched-mode LED display unit satisfying fire-fighting smoke exhaust and ventilation requirements includes an LED display unit 1, a mounting member 2, an opening-closing actuator 3, and a pressing member 4. The LED display unit 1 is mounted on the mounting member 2 and the mounting member 2 is mounted on a display panel by the opening-closing actuator 3 and pressed against the display panel by the pressing member 4. In particular, as shown in FIG. 3, the opening-closing actuator 3 is a motor assembly which is mounted on one side of the mounting member 2. The motor assembly includes a first steering engine 304, a connecting shaft 302, connecting pieces 303, and a bearing 306. At least two connecting pieces 303 are mounted on the connecting shaft 302. The connecting pieces 303 are mounted on the mounting member 2. The first steering engine 304 is connected to and fixed to an adjacent fixing unit by a first steering engine support 305. The connecting shaft 302 has one end connected to the steering engine 304 by a shaft sleeve 307 and the other end inserted into the bearing 306. The bearing 306 is fixed to the adjacent fixing unit. As shown in FIG. 6 and FIG. 7, the pressing member 4 takes the form of a high-temperature automatic tripping gear which includes a housing 404, a push rod 405, a nut 408, and thermal expansion glass 409. The housing 404 is fixed to an adjacent fixing unit by a housing support 407. The push rod 405 is sleeved with a spring 406. The push rod 405 has one end inserted into the housing 404 and the other end located outside the housing 404 to press the mounting member 2. The nut 408 is mounted at one end of the housing 404. The thermal expansion glass 409 is mounted at an end, located in the housing 404, of the push rod 405 and fastened by a locking screw 410. In case of a fire, when the temperature rises to a certain degree, the thermal expansion glass 409 is broken. Thereafter, the push rod 405 is pushed by the spring 406 to slide down, and the head of the push rod 405 is disengaged from the mounting member 2. As such, the mounting member 2 is not blocked by the push rod 405 anymore. The first steering engine 304 rotates, thereby causing the connecting shaft 302 to rotate. The connecting shaft 302 drives the connecting pieces 303 to rotate, and the connecting pieces 303 drive the mounting member 2 to rotate, such that "the window is opened". Accordingly, the fire smoke exhaust ventilation requirement of the internal surface or the external surface of the building is met. After the alarm is cleared, "the window is closed" (reset) such that the display screen becomes an integrated seamless one. The LED display unit 1 may be reset manually or automatically.

EXAMPLE 5

Figure 13:
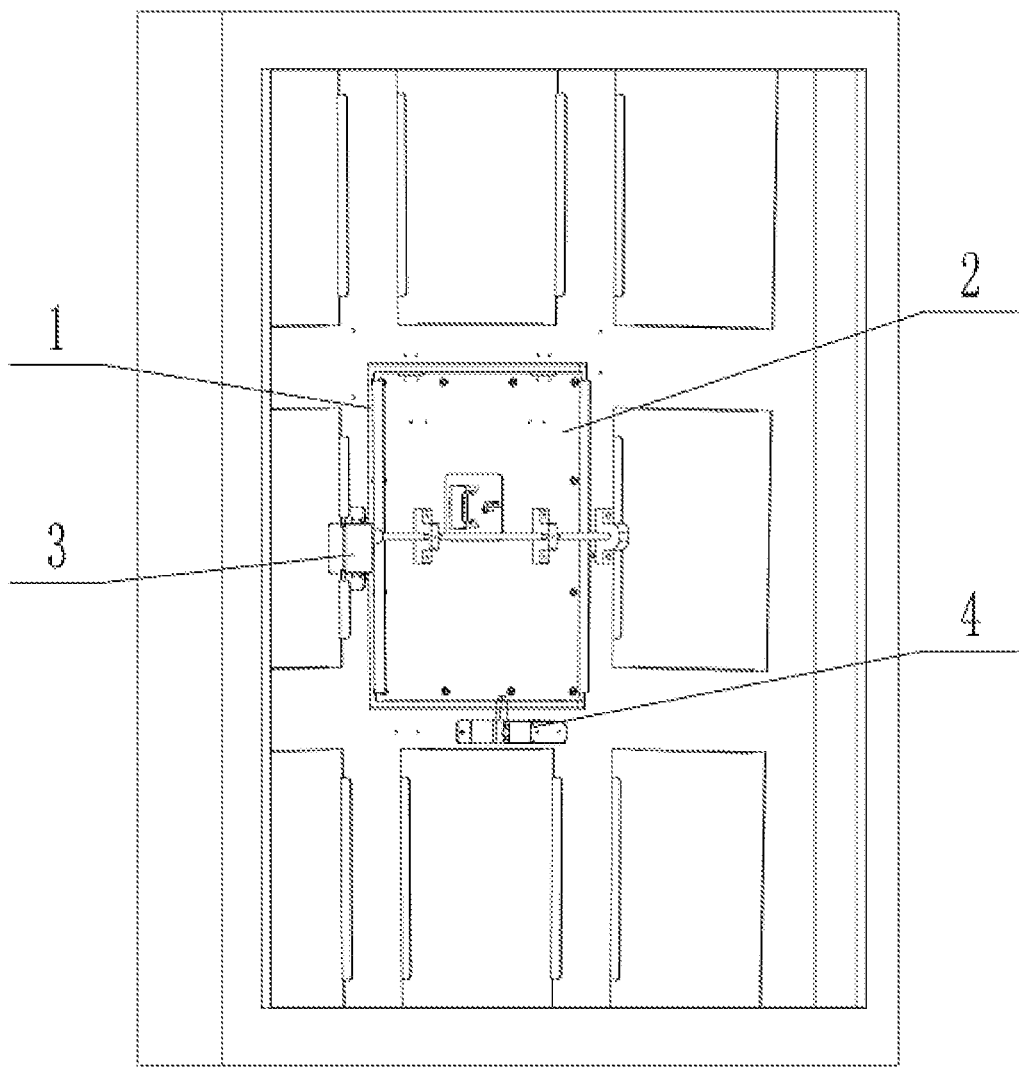
FIG. 13 is a structure diagram of Example 5 of the present disclosure.

As shown in FIG. 13, a switched-mode LED display unit satisfying fire-fighting smoke exhaust and ventilation requirements includes an LED display unit 1, a mounting member 2, an opening-closing actuator 3, and a pressing member 4. The LED display unit 1 is mounted on the mounting member 2 and the mounting member 2 is mounted on a display panel by the opening-closing actuator 3 and pressed against the display panel by the pressing member 4. In particular, as shown in FIG. 3, the opening-closing actuator 3 is a motor assembly which is mounted on one side of the mounting member 2. The motor assembly includes a first steering engine 304, a connecting shaft 302, connecting pieces 303, and a bearing 306. At least two connecting pieces 303 are mounted on the connecting shaft 302. The connecting pieces 303 are mounted on the mounting member 2. The first steering engine 304 is connected to and fixed to an adjacent fixing unit by a first steering engine support 305. The connecting shaft 302 has one end connected to the steering engine 304 by a shaft sleeve 307 and the other end inserted into the bearing 306. The bearing 306 is fixed to the adjacent fixing unit. As shown in FIG. 4 and FIG. 5, the pressing member 4 takes the form of an electrically controlled switch gear which includes a second steering engine 401, a stop piece 402, and a second steering engine support 403. The second steering engine 401 is connected to and fixed to an adjacent fixing unit by the second steering engine support 403, and the stop piece 402 drives and presses the mounting member 2 by the second steering engine 401. In case of a fire, the electrically controlled switch gear receives a triggering command (the triggering command is a signal given by a fire-fighting linkage control system of the building or a manually set signal) to work. The second steering engine 401 rotates to drive the stop piece 402 to rotate; as such, the mounting member 2 is not blocked by the stop piece 402 anymore and is driven by the spring hinge 301 to rotate. Thus, opening of the LED display unit 1 and the mounting member 2 is achieved, such that "the window is opened". Accordingly, the fire smoke exhaust ventilation requirement of the internal surface or the external surface of the building is met. After the alarm is cleared, "the window is closed" such that the display screen becomes an integrated seamless one. The LED display unit 1 may be reset manually or automatically.

EXAMPLE 6

Figure 14:
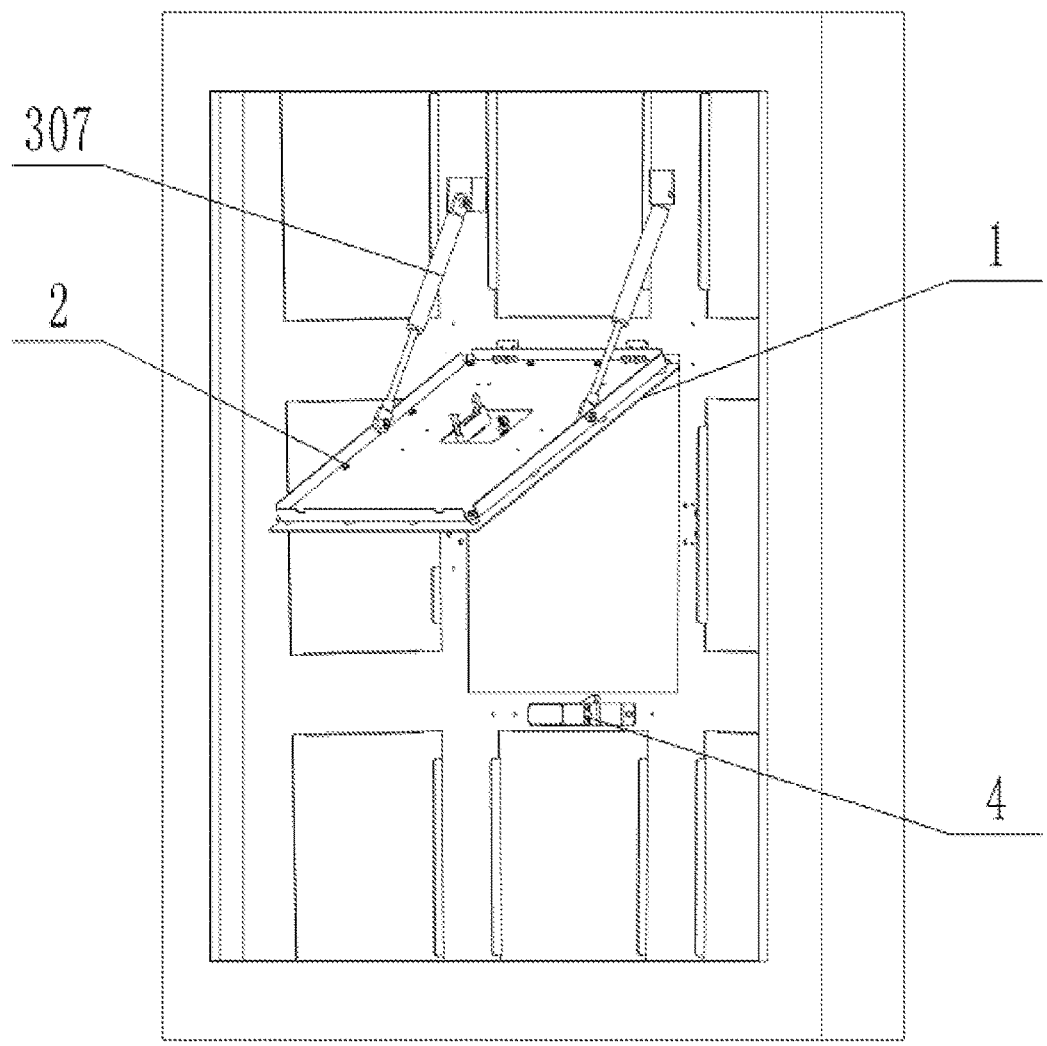
FIG. 14 is a structure diagram of Example 6 of the present disclosure.

As shown in FIG. 14, a switched-mode LED display unit satisfying fire-fighting smoke exhaust and ventilation requirements includes an LED display unit 1, a mounting member 2, an opening-closing actuator 3, and a pressing member 4. The LED display unit 1 is mounted on the mounting member 2 and the mounting member 2 is mounted on a display panel by the opening-closing actuator 3 and pressed against the display panel by the pressing member 4. In particular, the opening-closing actuator 3 is a pneumatic/hydraulic rod 307 which has one end fixed to an adjacent fixing unit by a mounting seat and the other end connected to the mounting member 2. One end of the mounting member 2 is hinged to the display panel. As shown in FIG. 4 and FIG. 5, the pressing member 4 takes the form of an electrically controlled switch gear which includes a second steering engine 401, a stop piece 402, and a second steering engine support 403. The second steering engine 401 is connected to and fixed to an adjacent fixing unit by the second steering engine support 403 and the stop piece 402 drives and presses the mounting member 2 by the second steering engine 401. In case of a fire, the electrically controlled switch gear receives a triggering command (the triggering command is a signal given by a fire-fighting linkage control system of the building or a manually set signal) to work. The second steering engine 401 rotates to drive the stop piece 402 to rotate; as such, the mounting member 2 is not blocked by the stop piece 402 anymore and is driven by the pneumatic/hydraulic rod 307 to rotate along the hinge. Thus, opening of the LED display unit 1 and the mounting member 2 is achieved, such that "the window is opened". Accordingly, the fire smoke exhaust ventilation requirement of the internal surface or the external surface of the building is met. After the alarm is cleared, "the window is closed" such that the display screen becomes an integrated seamless one. The LED display unit 1 may be reset manually or automatically.

EXAMPLE 7

Figure 15:
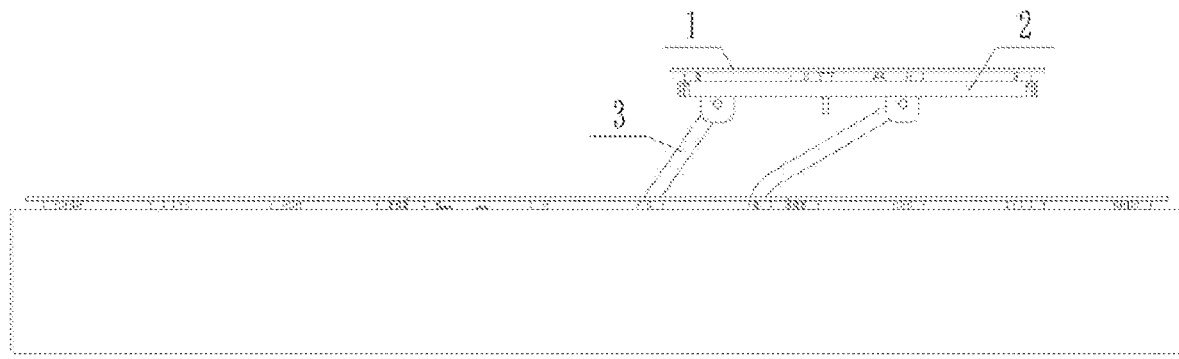
FIG. 15 is a structure diagram of Example 7 of the present disclosure.

As shown in FIG. 15, a switched-mode LED display unit satisfying fire-fighting smoke exhaust and ventilation requirements includes an LED display unit 1, a mounting member 2, an opening-closing actuator 3, and a pressing member 4. The LED display unit 1 is mounted on the mounting member 2 and the mounting member 2 is mounted on a display panel by the opening-closing actuator 3 and pressed against the display panel by the pressing member 4. In particular, the opening-closing actuator 3 is a pneumatic/hydraulic rod 307 which has one end fixed to an adjacent fixing unit by a mounting seat and the other end connected to the mounting member 2. As shown in FIG. 4 and FIG. 5, the pressing member 4 takes the form of an electrically controlled switch gear which includes a second steering engine 401, a stop piece 402, and a second steering engine support 403. The second steering engine 401 is connected to and fixed to an adjacent fixing unit by the second steering engine support 403, and the stop piece 402 drives and presses the mounting member 2 by the second steering engine 401. In case of a fire, the electrically controlled switch gear receives a triggering command (the triggering command is a signal given by a fire-fighting linkage control system of the building or a manually set signal) to work. The second steering engine 401 rotates to drive the stop piece 402 to rotate, as such, the mounting member 2 is not blocked by the stop piece 402 anymore and is driven by the pneumatic/hydraulic rod 307 to move forward. Thus, opening of the LED display unit 1 and the mounting member 2 is achieved, such that "the window is opened". Accordingly, the fire smoke exhaust ventilation requirement of the internal surface or the external surface of the building is met. After the alarm is cleared, "the window is closed" such that the display screen becomes an integrated seamless one. The LED display unit 1 may be reset manually or automatically.

The foregoing are descriptions of the preferred embodiments of the present disclosure, and those skilled in the art to which the present disclosure belongs may further make changes and modifications to the above embodiments. Therefore, the present disclosure is not limited to the above specific embodiments, and any obvious improvements, replacements or modifications made by those skilled in the art on the basis of the present disclosure should fall within the protection scope of the present disclosure.

What is claimed is:

1. A switched-mode light-emitting diode (LED) display unit satisfying fire-fighting smoke exhaust and ventilation requirements, comprising an LED display unit, a mounting member, an opening-closing actuator and a pressing member, wherein the LED display unit is mounted on the mounting member; and
  the mounting member is mounted on a display panel by the opening-closing actuator and the mounting member is pressed against the display panel by the pressing member,
  wherein the opening-closing actuator is a spring hinge, and the spring hinge is mounted on one side of the mounting member.

2. The switched-mode LED display unit according to claim 1, wherein the pressing member is an electrically controlled switch gear, and the electrically controlled switch gear comprises a second steering engine, a stop piece, and a second steering engine support; the second steering engine is connected to and fixed to an adjacent fixing unit by the second steering engine support; and the stop piece drives and presses the mounting member by the second steering engine.

3. The switched-mode LED display unit according to claim 1, wherein the pressing member is a high-temperature automatic tripping gear, and the high-temperature automatic tripping gear comprises a housing, a push rod, a nut, and thermal expansion glass; the housing is fixed to an adjacent fixing unit by a housing support; the push rod is sleeved with a spring; the push rod has a first end inserted into the housing and a second end located outside the housing to press the mounting member; the nut is mounted at one end of the housing; and the thermal expansion glass is mounted at an end, located in the housing, of the push rod and the thermal expansion glass is fastened by a locking screw.

4. A switched-mode light-emitting diode (LED) display unit satisfying fire-fighting smoke exhaust and ventilation requirements, comprising an LED display unit, a mounting member, an opening-closing actuator and a pressing member, wherein the LED display unit is mounted on the mounting member; and
  the mounting member is mounted on a display panel by the opening-closing actuator and the mounting member is pressed against the display panel by the pressing member,
  wherein the opening-closing actuator is a spring hinge assembly, and the spring hinge assembly is mounted in a middle of the mounting member; the spring hinge assembly comprises a spring hinge, a connecting shaft, and at least two connecting pieces; the at least two connecting pieces are mounted on the connecting shaft; the at least two connecting pieces are mounted on the mounting member; and the spring hinge is mounted at two ends of the connecting shaft and the spring hinge is connected to and fixed to an adjacent fixing unit by a spacer.

5. A switched-mode light-emitting diode (LED) display unit satisfying fire-fighting smoke exhaust and ventilation requirements, comprising an LED display unit, a mounting member, an opening-closing actuator and a pressing member, wherein the LED display unit is mounted on the mounting member; and
  the mounting member is mounted on a display panel by the opening-closing actuator and the mounting member is pressed against the display panel by the pressing member,
  wherein the opening-closing actuator comprises one of:
    a motor assembly, wherein the motor assembly comprises a first steering engine, a connecting shaft, at least two connecting pieces, and a bearing; the at least two connecting pieces are mounted on the connecting shaft; the at least two connecting pieces are mounted on the mounting member; the first steering engine is connected to and fixed to an adjacent fixing unit by a first steering engine support; the connecting shaft has a first end connected to the first steering engine by a shaft sleeve and a second end inserted into the bearing; and the bearing is fixed to the adjacent fixing unit; or
    a pneumatic/hydraulic rod, wherein the pneumatic/hydraulic rod has a first end fixed to an adjacent fixing unit by a mounting seat and a second end connected to the mounting member; and one end of the mounting member is hinged to the display panel.

* * * * *